Figure 1:
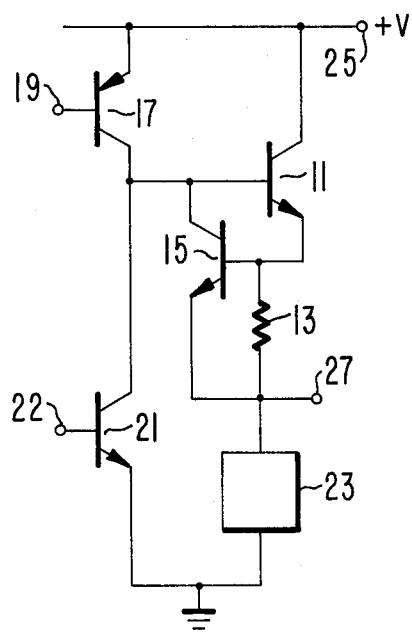

United States Patent [19]

Schade, Jr.

[11] 3,996,498
[45] Dec. 7, 1976

[54] CURRENT LIMITING CIRCUIT AND METHOD
[75] Inventor: Otto Heinrich Schade, Jr., North Caldwell, N.J.
[73] Assignee: RCA Corporation, New York, N.Y.
[22] Filed: May 19, 1975
[21] Appl. No.: 578,900
[52] U.S. Cl. .................. 317/33 VR; 317/33 R; 323/4; 323/9
[51] Int. Cl.² .................. H02H 3/08; H02H 7/20
[58] Field of Search ......... 317/33 VR, 33 R; 323/1, 323/4, 9, 22 T

[56] References Cited
UNITED STATES PATENTS

| | | | |
|---|---|---|---|
| 3,234,453 | 2/1966 | Klees et al. | 323/9 X |
| 3,527,997 | 9/1970 | Nercessian | 317/33 VR X |
| 3,714,512 | 1/1973 | Grabowski | 323/9 X |

Primary Examiner—Harold Broome
Assistant Examiner—Patrick R. Salce
Attorney, Agent, or Firm—H. Christoffersen; S. Cohen; K. Watov

[57] ABSTRACT

A sensing transistor has its base and emitter electrodes connected across a sensing resistor connected in series with the collector electrode of an output transistor. Whenever the collector current to the output transistor tends to exceed a predetermined value, the sensing transistor is turned on to reduce the base current being supplied from a current source to the base of the output transistor to thereby reduce this collector current to less than this value. This reduction is accomplished by diverting the excess portion of the source current through the collector-emitter current path of the sensing transistor, into the collector electrode of the output transistor.

10 Claims, 2 Drawing Figures

PRIOR ART

CURRENT LIMITING CIRCUIT AND METHOD

The present invention relates generally to transistorized amplifiers, and more particularly to such amplifiers including current limiting circuitry.

In general purpose transistor amplifier circuits, it is common to provide a current source capable of delivering much higher current than required for biasing the base electrodes of one or more of the output transistors of the amplifier. One reason is to enhance the frequency response of the amplifiers. It has been found that the transistors of such amplifiers must be protected against overdrive by the high magnitude current sources, when the output of the amplifier is short circuited by a low impedance path to ground.

One common circuit for protecting an output transistor of such amplifiers, includes a low value sensing resistor in series with the emitter electrode of the transistor to be protected. A sensing transistor is connected across this resistor at its base and emitter electrodes, and the collector of the sensing transistor is connected to the base electrode of the output transistor being protected. When the voltage drop across the sensing resistor reaches a given value, the sensing transistor turns on and its collector-emitter current path operates as a low impedance (between the base electrode of the output transistor, and the output terminal of the amplifier), and shunts any increase of base-current drive away from the output transistor into the output circuit or load. In this manner, the collector-emitter current of the output transistor being protected is limited to a predetermined value, thereby protecting the transistor from damage.

Honda U.S. Pat. No. 3,835,412 discloses a transistor amplifier protective circuit, which includes a sensing resistor in series with the collector electrode of one of the driver stage transistors of the amplifier. A voltage responsive transistorized relay driver is connected across the sensing resistor. When the collector current of the driver transistor attains a predetermined magnitude, the relay driver responds by operating a electromechanical relay, whose contacts open to disconnect the load from the output terminal of the amplifier.

The present inventor has recognized that the use of a protective circuit including a sensing resistor in circuits in series with the emitter electrode of an output transistor of an amplifier, increases the output impedance of typical monolithic amplifiers, where the sensing resistor may have a value of 25 to 100 ohms, for example. He also has recognized that the use of relay drivers and the use of electromechanical relays increases the complexity of the amplifier circuitry, and is cumbersome for use in integrated circuits.

In a circuit according to the present invention, the collector current of the transistor to be protected is sensed, and when it tends to exceed a given value, a portion of the bias current is diverted from the base electrode and is supplied instead to the collector electrode. The limitation in base current which results maintains the collector current at a safe value.

Figure 2:
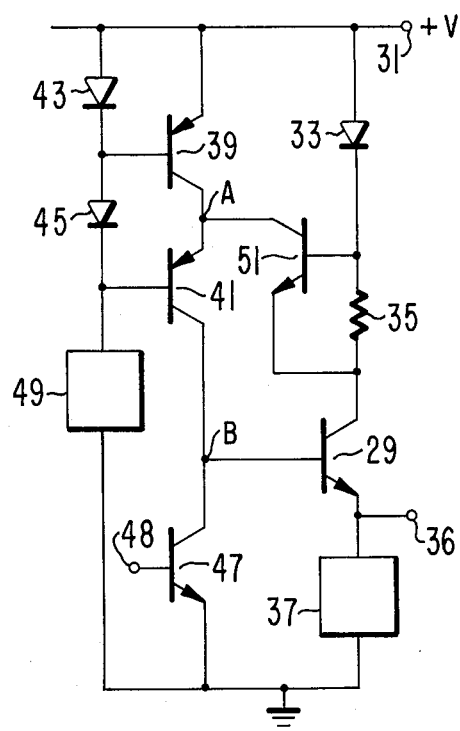

In the drawings:

FIG. 1 is a simplified schematic diagram of a prior art limiting circuit in the output stage of an amplifier; and FIG. 2 is a schematic diagram of the limiting circuit of the present invention as incorporated in the output stage of an amplifier.

FIG. 1 is a simplified schematic diagram of a prior art current limiting circuit. The output transistor 11 is protected by the current limiting circuit including sensing resistor 13 and sensing transistor 15, connected as shown. PNP transistor 17 provides a current source for supplying current to the base electrode of the output transistor 11 and to signal amplifier transistor 21. Terminal 22 is receptive of an input signal. The current source transistor 17 is biased by a reference voltage applied to its input terminal 19. Current sink 23 is provided for the output transistor 11. The signal amplifier 21 and current sink 23 may be returned to a reference potential such as ground. A positive voltage supply or operating potential is connected at terminal 25.

In operation, the value of sensing resistor 13 is chosen to provide a turn-on voltage across the base-emitter electrodes of sensing transistor 15, whenever the emitter current of output transistor 11 exceeds a predetermined value. When transistor 15 so turns on, it shunts base current via its collector-emitter electrode current path to the current sink 23 and output terminal 27. In this manner, the output transistor 11 is protected from over-dissipation, but the limiting circuit has the drawback of increasing the output impedance of the amplifier by the value of the sensing resistor, as well as reducing the output-potential range by (1) $V_{be}$. This may be objectionable in certain applications, although this type of limiting circuit has found common application in many amplifiers. A more detailed description of this type of limiting circuit may be found in U.S. Pat. No. 3,536,958 of Sondermeyer, and in U.S. Pat. No. 3,500,218 of Burwen.

The embodiment of the present invention illustrated in FIG. 2 is for the protection of an output transistor 29 of an amplifier. It is to be understood that the invention is equally suitable for protecting or current limiting other transistor stages.

The circuit includes a power terminal 31 for connection to an operating voltage +V. A diode 33 is connected in series with a resistor 35 between the power terminal 31 and the collector electrode of output NPN transistor 29. The anode of the diode 33 is connected to the power terminal 31. The emitter electrode of the output transistor 29 is connected both to an output terminal 36 and to a current sink 37, the other end of which is connected to a reference potential, ground in this example.

A current source is provided by a pair of cascoded PNP transistors 39, 41. Transistor 39 has its emitter electrode connected to power terminal 31, its collector electrode connected to the emitter electrode of transistor 41, and its base electrode connected to the common connection of the cathode and anode electrodes of two diodes 43, 45, respectively. Transistor 41 has its collector electrode connected in common with the base electrode of output transistor 29 and the collector electrode of signal amplifier NPN transistor 47, and its base electrode connected to the common connection of the cathode electrode of diode 45 and one end of a current sink 49. The other end of current sink 49 is connected to ground. Signal amplifier transistor 47 also has its base and emitter electrodes connected to a signal input terminal 48, and to ground, respectively. The anode electrode of diode 43 is connected to power terminal 31.

A sensing NPN transistor 51 has its collector electrode connected to the common connection of the collector and emitter electrodes of transistors 39 and 41, respectively, its base electrode connected to the common connection of diode 33 and sensing resistor 35, and its emitter electrode connected to the common connection of resistor 35 and the collector electrode of output transistor 29.

In the operation of the circuit of FIG. 2, diode 33 provides an offset voltage. It is included to avoid saturation of the sensing transistor 51, by insuring that the base electrode of this transistor is at least $1V_{be}$ (the voltage drop across the diode 33) below the positive voltage +V connected to the power terminal 31. The value of the sensing resistor 35 is chosen to provide a turn-on voltage of $1V_{be}$ across the base-emitter electrodes of sensing transistor 51, whenever the collector current of the output transistor 29 exceeds a predetermined magnitude.

The cascoded current source including transistors 39 and 41 is capable of delivering a base bias current to the base electrode of the output transistor 29, substantially in excess of the base current required for this transistor to produce a collector current at the predetermined magnitude, in addition to supplying necessary operating current to signal amplifier 47. Collector currents above the predetermined magnitude may damage the transistor 29. The provision of this excess current capability from current source 39, 41 provides a faster slew rate of the source, enhancing the high frequency response of the amplifier.

For proper operation of the current source 39, 41, a bias of $1V_{be}$ must be provided across the base-emitter electrodes of transistors 39 and 41. Such biasing may be provided in many ways, and in this example, is provided by the series circuit including diodes 43 and 45, and current sink 49, regardless of the value of +V. With such biasing, the collector electrode of sensing transistor 51 is held or clamped at a potential $1V_{be}$ below +V. (The potential at the base of transistor 41 is [+V − $2V_{be}$] because of diodes 43 and 45; the potential at the collector of transistor 51 is $1V_{be}$ higher than this in view of the base-emitter junction of transistor 41.) Transistor 41 is included to insure that the base electrode of the output transistor 29 can be modulated by an input signal. If transistor 41 were absent, the collector-base junction of sensing transistor 51 would become forward biased during a large negative signal excursion, clamping the base electrode of the output transistor to $2V_{be}$ below the supply voltage +V and preventing amplifier operation.

When the collector current of the output transistor 29 exceeds a predetermined value, the voltage drop across the sensing resistor 35 turns on the sensing transistor 51. The portion of the current available from the current source 39, 41, in excess of the desired base bias current, is diverted from the common connection of transistors 39 and 41 (output terminal A of the current source), and passes instead through the collector-emitter current path of the sensing transistor 51, and into the collector electrode of output transistor 29. This excess current then flows through the collector-emitter electrode path of the output transistor 29, and from there partly into the load (not shown) connected to the output terminal 36, and partly into the current sink 37, depending upon the relative impedance values of the load and sink 37.

In other words, when current is diverted from output terminal A of current source 39, 41 to transistor 51, a smaller current is available at the collector of transistor 41 (output terminal B of current source 39, 41) resulting in a limited magnitude of base current to transistor 29. This reduction in base current concurrently limits the magnitude of current flow through the collector-emitter current path of transistor 29, and from there into the load, preventing damage to transistor 29. It should be noted that the current so diverted to the collector of output transistor 29 will usually have a magnitude in the microampere range, whereas the magnitude of total collector current flowing into transistor 29 may be in the milliampere range, for example.

When the collector current of transistor 29 has a magnitude below the predetermined value, sensing transistor 51 is turned off. Sensing transistor 51 will be turned on only when the collector current of transistor 29 exceeds the predetermined value. In essence, transistor 51 is being operated as a normally-open switch.

In a typical application, the beta of the NPN output transistor 29 may have a value of 100 for example. If the collector current of the output transistor 29 is to be limited at 20 milliamperes (ma) the base bias current delivered from current source 39, 41 to the base electrode of output transistor 29, must be limited to 200 microamperes ($\mu a$). If the current source 39, 41, is designed to deliver 500 $\mu a$, 300 $\mu a$ is made available for signal amplifier 47. Any excess of load current beyond 20 ma causes 51 to conduct, reducing that current made available to amplifier 47 without essentially increasing the drive of transistor 29. A continued demand for excess load current eventually results in approximately 300 $\mu a$ being conducted by 51; i.e., the total current in excess of the "limiting" 29 base drive. The value of the sensing resistor 35 is equal to $1V_{be}$ divided by 20 milliamperes, that is, it may be 30 ohms or so in this example, assuming $1V_{be} \cong 0.6$ volt.

In practice, the output transistor 29 may be replaced by a pair of transistors interconnected in a Darlington configuration. If the Darlington transistors were each identical to transistor 29, then for the example given above, only 2 microamperes of base current need be applied to the Darlington configured output transistors, to obtain a collector current of 20 milliampere, the limiting value. In such a case, the capacity of the current source could be reduced by 198 $\mu a$, the reduction in base bias current required.

An advantage of the present current limiting circuit, as contrasted to the prior art circuit of FIG. 1, is that the current sensing elements resistor 35 and transistor 51 do not capacitively load the output terminal 36 or the input terminal 48 (the signal path). Another is that the resistor 35 can be at a moderate level — say in the tens-to-hundreds of ohms range (depending upon the circuit design) without affecting the output impedance. Also, the circuit is simple, easily integrated and also useful as well in descrete circuits. Sensing resistor 35 can be placed in integrated circuit form as an N+ diffusion.

What is claimed is:
1. A current limiting circuit comprising:
a power terminal for an operating potential;
an output terminal;
an output transistor having an emitter electrode connected to said output terminal, and base and collector electrodes;
current source means connected between said power terminal and said base electrode, for supplying base current to said output transistor;
current sensing means connected between said power terminal and said collector electrode, for producing a voltage indicative solely of the current passing into said collector electrode; and a sensing transistor of the same conductivity type as said output transistor having emitter, base, and collector electrodes, and an emitter-base junction, connected at its collector electrode to said current source means and at its emitter electrode to said collector electrode of said output transistor, and said base emitter junction being connected across said current sensing means, said sensing transistor turning on in response to a voltage of greater than a given magnitude produced by said current sensing means for diverting a portion of the current supplied by said current source means through the collector-emitter path of said sensing transistor directly to said collector electrode of said output transistor, thereby reducing the base current supplied to said output transistor.

2. The current limiting circuit of claim 1, wherein said current source means includes:
 first and second sources of bias potential;
 first and second transistors, each of opposite conductivity to said output transistor;
 said first transistor having an emitter electrode connected to said power terminal, a base electrode connected to said first source of bias potential, and a collector electrode connected to the collector electrode of said sensing transistor and;
 said second transistor having an emitter electrode connected to the collector electrode of said first transistor, a base electrode connected to said second source of bias potential, and a collector electrode connected to the base electrode of said output transistor.

3. A current limiting circuit as set forth in claim 1 wherein said current source means includes two output terminals through which the current provided by said source can flow, one connected to said base electrode of said output transistor through which a portion of the current of said source normally flows, and the other connected to the collector electrode of said sensing transistor, through which none of the current provided by said source flows, when said sensing transistor is off, but through which a portion of said current flows when the sensing transistor turns on.

4. The current limiting circuit as set forth in claim 3, wherein said current source further includes:
 a pair of cascoded transistors each having a base electrode, a collector electrode of one and an emitter electrode of the other being connected to said one output terminal, an emitter electrode of said one and a collector electrode of said other cascoded transistors being connected to said power terminal and said other current output terminal, respectively, an equivalent bias potential being individually applied across the base and emitter electrodes of each one of said cascoded transistors.

5. The current limiting circuit as set forth in claim 1, further including:
 a diode connected between said power terminal and the base electrode of said sensing transistor, said diode being poled for passing the collector current of said output transistor; and
 wherein said current sensing means includes a sensing resistor connected across the base and emitter electrodes of said sensing transistor, and having a value equal to $1V_{be}$ divided by the predetermined magnitude of said collector current to said output transistor.

6. A current limiting circuit comprising:
 an output terminal;
 an output transistor having an emitter electrode connected to said output terminal, and base and collector electrodes;
 current source means connected between said power terminal and said base electrode, for supplying base current to said output transistor;
 a sensing transistor of like conductivity to said output transistor, having a collector electrode connected to said current source means, an emitter electrode connected to the collector electrode of said output transistor, and a base electrode coupled to said power terminal;
 semiconductor junction means connected between said power terminal and the base electrode of said sensing transistor, for preventing saturation of said sensing transistor; and
 a sensing resistor connected between the base and collector electrodes of said sensing and output transistors, respectively, the value of said sensing resistor being determinative of a predetermined magnitude of collector current for turning on said sensing transistor, for shunting base current from said current source means into said collector electrode of said output transistor, thereby limiting the collector current of said output transistor.

7. The current limiting circuit of claim 6, wherein said semiconductor junction means comprises a diode poled to the collector current of said output transistor.

8. The combination comprising:
 a power terminal for connection to an operating potential;
 an output terminal;
 an output transistor having an emitter electrode coupled to said output terminal, a collector coupled to said power terminal, and a base electrode;
 current limiting means connected between said base bias means and the collector electrode of said output transistor, and responsive to a predetermined magnitude of collector current, for diverting a portion of said base bias current from said base bias means to said collector electrode;
 first and second reference potentials; and
 a pair of cascoded transistors of opposite conductivity to said output transistor, each one of said pair of transistors having a base electrode connected individually to said first and second reference potentials, respectively, an emitter electrode connected individually to said power terminal and said current limiting means, respectively, and a collector electrode connected individually to said current limiting means and the base electrode of said output transistor, respectively, for supplying a base bias current to said output transistor.

9. The combination of claim 8, wherein said current limiting means includes:
 a sensing transistor having a collector electrode connected to the common connection of said collector and emitter electrodes of said pair of cascoded transistors, respectively, an emitter electrode connected to the collector electrode of said output transistor, and a base electrode:
 semiconductor junction means connected between said power terminal and the base electrode of said sensing transistor; and
 a sensing resistor connected between the base electrode of said sensing transistor and the collector electrode of said output transistor, the value of said sensing resistor being determinative of the limiting magnitude of collector current of said output transistor for turning on said sensing transistor.

10. The combination of claim 9, wherein said semiconductor junction means is a diode oriented in a like current direction to the emitter electrode of said output transistor.

* * * * *